(12) United States Patent
Heo et al.

(10) Patent No.: US 10,454,051 B2
(45) Date of Patent: Oct. 22, 2019

(54) DISPLAY APPARATUS

(71) Applicant: SAMSUNG DISPLAY CO., LTD., Yongin-si, Gyeonggi-do (KR)

(72) Inventors: Seyoung Heo, Yongin-si (KR); Minsoo Kim, Yongin-si (KR); Kyubong Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/826,992

(22) Filed: Nov. 30, 2017

(65) Prior Publication Data

US 2018/0190923 A1 Jul. 5, 2018

(30) Foreign Application Priority Data

Jan. 5, 2017 (KR) .................. 10-2017-0001790

(51) Int. Cl.
*H01L 51/50* (2006.01)
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5012* (2013.01); *H01L 27/3246* (2013.01); *H01L 27/3248* (2013.01); *H01L 27/3258* (2013.01); *H01L 51/5209* (2013.01); *H01L 51/5225* (2013.01); *H01L 51/5253* (2013.01); *H01L 51/5262* (2013.01); *H01L 51/56* (2013.01); *H01L 51/0097* (2013.01); *H01L 2227/323* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 10,177,208 | B2 * | 1/2019 | Park .................... | H01L 27/3258 |
| 2007/0040953 | A1 | 2/2007 | Huang et al. | |
| 2015/0001477 | A1 * | 1/2015 | Namkung .......... | H01L 27/3258 |
| | | | | 257/40 |
| 2015/0144906 | A1 * | 5/2015 | Ichikawa ............ | H01L 51/5228 |
| | | | | 257/40 |
| 2015/0236076 | A1 * | 8/2015 | Sim ..................... | H01L 27/3218 |
| | | | | 257/40 |
| 2016/0226013 | A1 * | 8/2016 | Liu ..................... | H01L 51/5209 |
| 2017/0012087 | A1 * | 1/2017 | Seo ..................... | H01L 27/3227 |
| 2017/0139442 | A1 * | 5/2017 | Yoshizumi ............. | G04G 9/04 |
| 2017/0287997 | A1 * | 10/2017 | Park .................... | H01L 27/3258 |

FOREIGN PATENT DOCUMENTS

KR 10-2016-0017260 A 2/2016

* cited by examiner

*Primary Examiner* — Shaun M Campbell
(74) *Attorney, Agent, or Firm* — Lewis Roca Rothgerber Christie LLP (57) ABSTRACT

A display apparatus includes a base substrate layer, a circuit layer, a light-emitting element layer, and an encapsulation layer. The base substrate layer includes a display area. The circuit layer is on the base substrate layer and includes at least one transistor. The light-emitting element layer is connected to the circuit layer and includes at least one light-emitting element in the display area. The at least one light-emitting element has an exiting surface emitting light and a step shape. The encapsulation layer is on the light-emitting element layer.

9 Claims, 9 Drawing Sheets

DISPLAY APPARATUS

CROSS-REFERENCE TO RELATED APPLICATION

Korean Patent Application No. 10-2017-0001790, filed on Jan. 5, 2017, and entitled, "Display Apparatus," is incorporated by reference herein in its entirety.

BACKGROUND OF THE INVENTION

1. Field

One or more embodiments described herein relates to a display apparatus.

2. Description of the Related Art

A variety of flat panel displays have been developed. Examples include liquid crystal displays, field emission displays, plasma display panels, organic light emitting diode (OLED) displays. An OLED display has as rapid response speed and low power consumption and generates light based on recombination of electrons and holes in an organic emission layer.

SUMMARY

In accordance with one or more embodiments, a display apparatus includes a base substrate layer including a display area; a circuit layer on the base substrate layer and including at least one transistor; a light-emitting element layer connected to the circuit layer and including at least one light-emitting element in the display area, the at least one light-emitting element having an exiting surface emitting light and a step shape; and an encapsulation layer on the light-emitting element layer. The base substrate layer may include flexible materials.

The circuit layer may include a transistor includes an active pattern, a gate electrode, a source electrode, and a drain electrode; and a planarization layer thickly on the transistor. The light-emitting element layer may include a pixel electrode connected to the circuit layer through a via-hole; a pixel definition layer including an opening defining a light-emitting area of the at least one light-emitting element; a light-emitting layer in the opening and having the step shape; and a common electrode on the light-emitting layer and the pixel definition layer.

The light-emitting element layer may include a pixel electrode connected to the circuit layer through a via-hole; a pixel definition layer including an opening defining a light-emitting area of the at least one light-emitting element; a light-emitting layer in the opening; and a common electrode on the light-emitting layer and pixel definition layer.

The circuit layer may include a transistor including an active pattern, a gate electrode, a source electrode, and a drain electrode; and a planarization layer on the transistor and including a step pattern in an area corresponding to the opening. The circuit layer may include a transistor including an active pattern, gate electrode, a source electrode, and a drain electrode; and a planarization layer thickly on the transistor.

The light-emitting element layer may include a pixel definition layer including an opening defining a light-emitting area of the at least one light-emitting element; a pixel electrode connected to the circuit layer through a via-hole and having the step shape corresponding to the opening; a light-emitting layer on the pixel electrode having the step shape in the opening; and a common electrode on the light-emitting layer and the pixel definition layer.

The display apparatus may include a plurality of light-emitting elements in the display area, wherein each of the light-emitting elements has an exiting surface of a step shape and wherein an angle of inclination of the exiting surface in a central area of the display area is different from an angle of inclination of the exiting surface in an edge area of the display area. The angles of inclination of the light-emitting elements may have a bilateral symmetry with respect to the central area.

In accordance with one or more other embodiments, a display apparatus includes a display substrate including a display area of a convex surface having a curvature; a first light-emitting element in a first area corresponding to a central area of the display area and including a first exiting surface; a second light-emitting element in a second area adjacent to a first side portion of the first area and including a second exiting surface having a first angle of inclination corresponding to a curvature of the second area; and a third light-emitting element in a third area adjacent to a first side portion of the second area and including a third exiting surface having a second angle of inclination corresponding to a curvature of the third area. The second and third exiting surfaces may be parallel to the first exiting surface. The first, second, and third exiting surfaces may have equal lengths. The second angle of inclination may be greater than the first angle of inclination.

The first light-emitting element may include a first deposited surface on which the first light-emitting element is formed and is opposite to the first exiting surface, the second light-emitting element includes a second deposited surface on which the second light-emitting element is formed and is opposite to the second exiting surface, and the third light-emitting element includes a third deposited surface on which the third light-emitting element is formed and is opposite to the third exiting surface. A length of the second deposited surface may be based on the first angle of inclination. A length of the third deposited surface may be based on the second angle of inclination.

The display apparatus may include a fourth light-emitting element in a fourth area adjacent to a second side portion of the first area and including a fourth exiting surface having a third angle of inclination opposite to the first angle of inclination; and a fifth light-emitting element in a fifth area adjacent to a second side portion of the fourth area and including a fifth exiting surface having a fourth angle of inclination opposite to second angle of inclination. The fourth and fifth exiting surfaces may be parallel to the first exiting surface. The first, fourth, and fifth exiting surfaces may have equal lengths.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
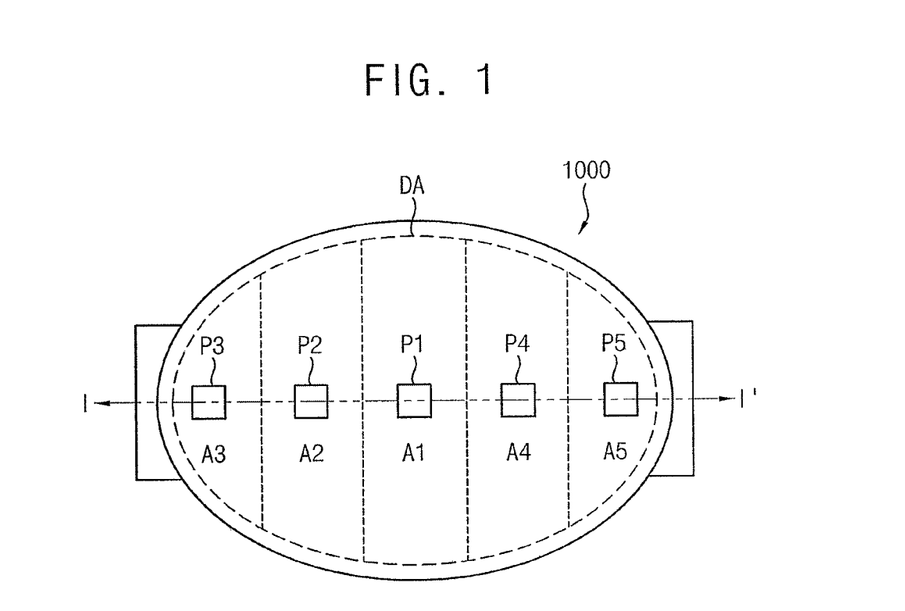
FIG. 1 illustrates an embodiment of a display apparatus.
Figure 2:
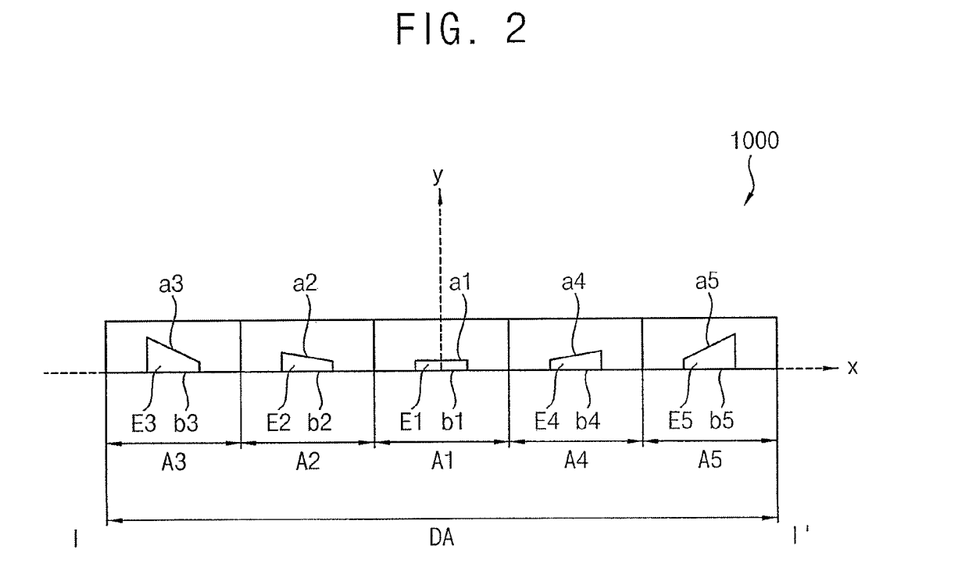
FIG. 2 illustrates a view taken along section line I-I' in FIG. 1.

FIGS. 1 and 2 illustrates an embodiment of a display apparatus 1000 that includes a display area DA and a plurality of areas A1, A2, A3, A4 and A5. The display area DA may include a convex surface having a predetermined curvature.

The first area A1 may correspond to a central area of the display area DA and may include a plurality of first pixels P1. A first pixel P1 in the first area A1 may include a first light-emitting element E1 which emits a light. The first light-emitting element E1 may be an organic light emitting diode. The first light-emitting element E1 may include a first exiting surface a1 from which light exits and a first deposited surface b1 on which the first light-emitting element E1 is formed. The first exiting surface a1 and first deposited surface b1 may be parallel to an x-axis.

The second area A2 may be adjacent to a first side portion (for example, a left side portion) of the first area A1 and may include a plurality of second pixels P2. A second pixel P2 in the second area A2 may include a second light-emitting element E2 which emits a light. The second light-emitting element E2 may be an organic light emitting diode. The second light-emitting element E2 may include a second exiting surface a2 from which the light exits and a second deposited surface b2 on which the second light-emitting element E2 is formed. The second deposited surface b2 may be parallel to the x-axis and the second exiting surface a2 may be inclined at a first angle with respect to the x-axis.

The third area A3 may be adjacent to a left side portion of the second area A2 and may include a plurality of third pixels P3. A third pixel P3 of the third area A3 may include a third light-emitting element E3. The third light-emitting element E3 may be an organic light emitting diode. The third light-emitting element E3 may include a third exiting surface a3 from which the light exits and a third deposited surface b3 on which the third light-emitting element E3 is formed. The third deposited surface b3 may be parallel to the x-axis and the third exiting surface a3 may be inclined at a second angle (greater than the first angle) with respect to the x-axis.

The fourth area A4 may be adjacent to a second side portion (for example, a right side portion) of the first area A1 and may include a plurality of fourth pixels P4. A fourth pixel P4 of the fourth area A4 may include a fourth light-emitting element E4. The fourth light-emitting element E4 may be an organic light emitting diode. The fourth light-emitting element E4 may include a fourth exiting surface a4 from which the light exits and a fourth deposited surface b4 on which the fourth light-emitting element E4 is formed. The fourth deposited surface b4 may be parallel to the x-axis and the fourth exiting surface a4 may be inclined at a first opposing angle opposite to the first angle with respect to the x-axis.

The fifth area A5 may be adjacent to a right side portion of the fourth area A4 and may include a plurality of fifth pixels P5. A fifth pixel P5 of the fifth area A5 may include a fifth light-emitting element E5. The fifth light-emitting element E5 may be an organic light emitting diode. The fifth light-emitting element E5 may include a fifth exiting surface a5 from which the light exits and a fifth deposited surface b5 on which the fifth light-emitting element E5 is formed. The fifth deposited surface b5 may be parallel to the x-axis and the fifth exiting surface a5 may be inclined at a second opposing angle opposite to the second angle with respect to the x-axis.

According to the exemplary embodiment, each of the light-emitting elements may have an exiting surface of a step shape. Also, an inclined angle of the exiting surface in a central area of the display area may be different from that of the exiting surface in an edge area of the display area. The exiting surface of the light-emitting element may be inclined at a predetermined angle with respect to a deposited surface of the light-emitting element based on the location of the light-emitting element in the display area.

Figure 3:
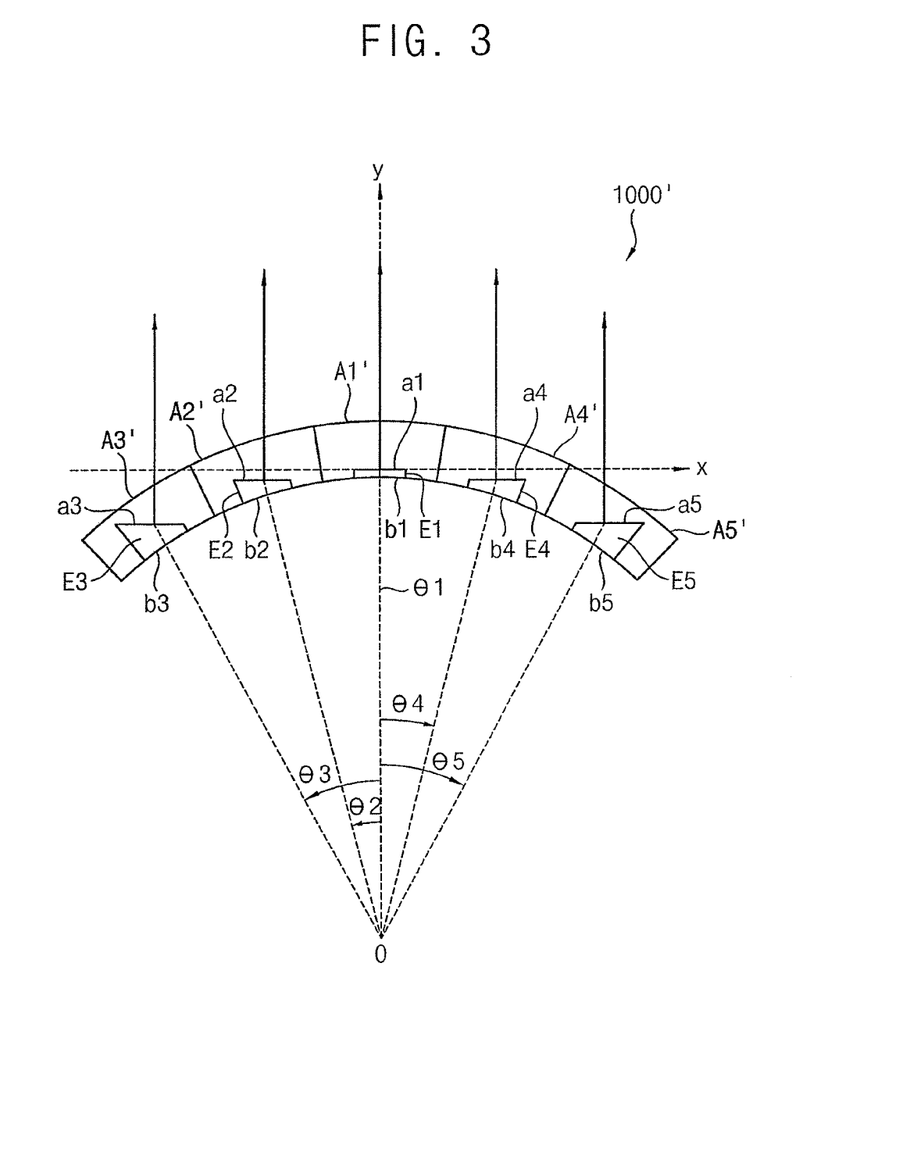
FIG. 3 illustrates an embodiment of a bended display apparatus.
Figure 4:
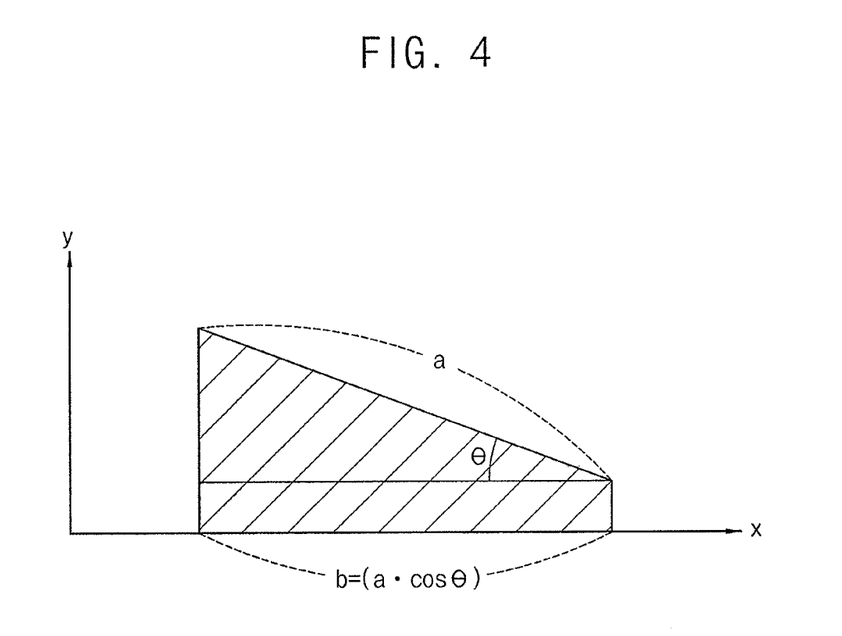
FIG. 4 illustrates an embodiment of a light-emitting element.

FIG. 3 illustrates an embodiment of a banded display apparatus, and FIG. 4 illustrates an embodiment of a light-emitting element. Referring to FIGS. 3 and 4, the display apparatus 1000' may include a display area having a convex surface with bilateral symmetry with respect to a y-axis. The y-axis is a central axis passing through a center point O.

A first area A1' may be at a central area of the display area and may have a first inclined angle θ1 corresponding to a first curvature. The first inclined angle θ1 may substantially correspond to 0 degrees. A first light-emitting element E1 in the first area A1' may include a first deposited surface b1 having a length substantially equal to that of the first exiting surface a1. Thus, the first exiting surface a1 and the first deposited surface b1 may be parallel to an x-axis.

A second area A2' may be adjacent to a left side portion of the first area A1'. The second area A2' may have a second inclined angle θ2 corresponding to a second curvature. A second light-emitting element E2 in the second area A2' may include a second exiting surface a2 which is inclined to the second inclined angle θ2 with respect to the second deposited surface b2. Referring to FIG. 4, the second deposited surface b2 may have a length such as (a2·cos θ2) with respect to the second exiting surface a2.

A third area A3' may be adjacent to a left side portion of the second area A2'. The third area A3' may have a third inclined angle θ3 corresponding to a third curvature. A third light-emitting element E3 in the third area A3' may include a third exiting surface a3 inclined relative to the third inclined angle θ3 with respect to the third deposited surface b3. Referring to FIG. 4, the third deposited surface b3 may have a length such as (a3·cos θ3) with respect to the third exiting surface a3.

A fourth area A4' may be adjacent to a right side portion of the first area A1'. The fourth area A4' may have a fourth inclined angle θ4 corresponding to a fourth curvature. The fourth inclined angle θ4 may be an angle −θ2 opposite to the second inclined angle θ2. A fourth light-emitting element E4 in the fourth area A4' may include a fourth exiting surface a4 inclined relative to the fourth inclined angle θ4 with respect to the fourth deposited surface b4. Referring to FIG. 4, the fourth deposited surface b4 may have a length such as (a4·cos θ4) with respect to the fourth exiting surface a4.

A fifth area A5' may be adjacent to a right side portion of the fourth area A4'. The fifth area A5' may have a fifth inclined angle θ5 corresponding to a fifth curvature. The fifth inclined angle θ5 may be an angle −θ3 opposite to the third inclined angle θ3. A fifth light-emitting element E5 in the fifth area A5' may include a fifth exiting surface a5 which is inclined relative to the fifth inclined angle θ5 with respect to the fifth exiting surface a5. Referring to FIG. 4, the fifth deposited surface b5 may have a length such as (a5·cos θ5) with respect to the fifth exiting surface a5.

According to the exemplary embodiment, the first to fifth exiting surfaces a1 to a5 of the first to fifth light-emitting elements E1 to E5, which are disposed on the display area of the convex surface, are parallel to the x-axis. Lengths of the exiting surfaces a1 to a5 are the same as each other and lengths of the deposited faces b1 to b5 are different according to the inclined angles of the exiting surfaces a1 to a5. The first to fifth exiting surfaces a1 to a5 may exit light at a same exiting direction (e.g., the y-axis direction). Thus, visibility of an image displayed on the display apparatus may be improved.

Figure 5:
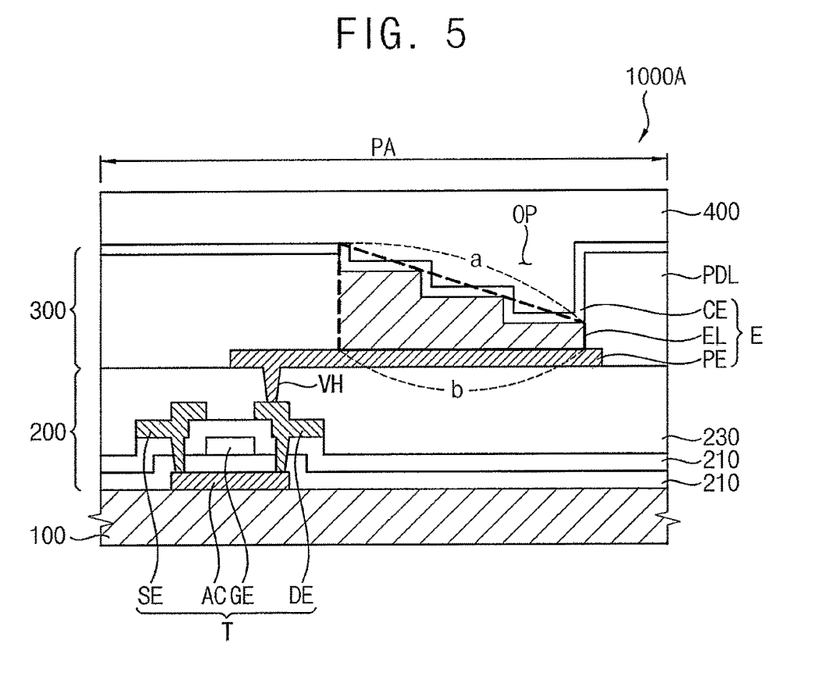
FIG. 5 illustrates another embodiment of a display apparatus.

FIG. 5 is a cross-sectional view of another embodiment of a display apparatus 1000A which may include a base substrate layer 100, a circuit layer 200, a light-emitting element layer 300, and an encapsulation layer 400. The base substrate layer 100 may include transparent plastic, for example, polyimide, polyethylenenaphtalate, polyethyleneterephthalate, polyarylate, polycarbonate, polyrtherlmide, or polyethersulfone. The base substrate layer 100 may include a plurality of pixel areas PA respectively corresponding to a plurality of pixels.

The circuit layer 200 may be on the base substrate layer 100 and may include at least one transistor T. The transistor T may include an active pattern AC, a gate electrode GE, a source electrode SE, and a drain electrode DE. A gate insulating layer 210 may be between the active pattern AC and the gate electrode GE. The active pattern AC may be formed, for example, of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), or magnesium (Mg). These compounds may be used alone or in combination. The gate insulating layer 210 may include, for example, silicone compound, metallic oxide, etc.

An intercalation insulating layer 220 may be between the gate electrode GE and the source electrode SE. The intercalation insulating layer 220 may be between the gate electrode GE and the drain electrode DE. The intercalation insulating layer 220 may include, for example, silicon nitride, silicon oxide, silicon oxynitride, etc. A planarization layer 230 may be disposed to a predetermined thickness on the transistor to protect the transistor T.

The light-emitting element layer 300 may be on the circuit layer 200 and may include a pixel electrode PE, a pixel definition layer PDL, a light-emitting layer EL and a common electrode CE. The pixel electrode PE may be connected to the transistor T through a via-hole VH in the planarization layer 230.

The pixel definition layer PDL may be on the planarization layer 230 on which the pixel electrode PE is formed, and may include an opening OP which defines the light-emitting element E. For example, the opening OP may expose the pixel electrode PE and a deposited surface b of the light-emitting element E may be defined by the exposed pixel electrode PE.

The light-emitting layer EL may be in an opening OP and may have a step shape in a cross-sectional view. An exiting surface of the light-emitting element E may have the step shape according to the light-emitting layer EL, which has the step shape in a cross-sectional view.

The common electrode CE may be on the base substrate layer 100 on which the light-emitting layer EL is formed.

The light-emitting element E may be defined by the pixel electrode PE, the pixel definition layer PDL, the light-emitting layer EL, and the common electrode CE.

The encapsulation layer 400 may be on the common electrode CE and may include a plurality of inorganic layers or a suitable combination thereof. The encapsulation layer 400 may protect the light-emitting element E.

According to the exemplary embodiment, in a cross-sectional view, the light-emitting element may include the light-emitting layer having a step shape. Thus, the exiting surface of the light-emitting element may be inclined. The angle of inclination of the exiting surface may be determined according to the curvature of an area of the display area in which the light-emitting element is located. A length of the deposited surface may be determined according to the inclined angle.

Figure 6:
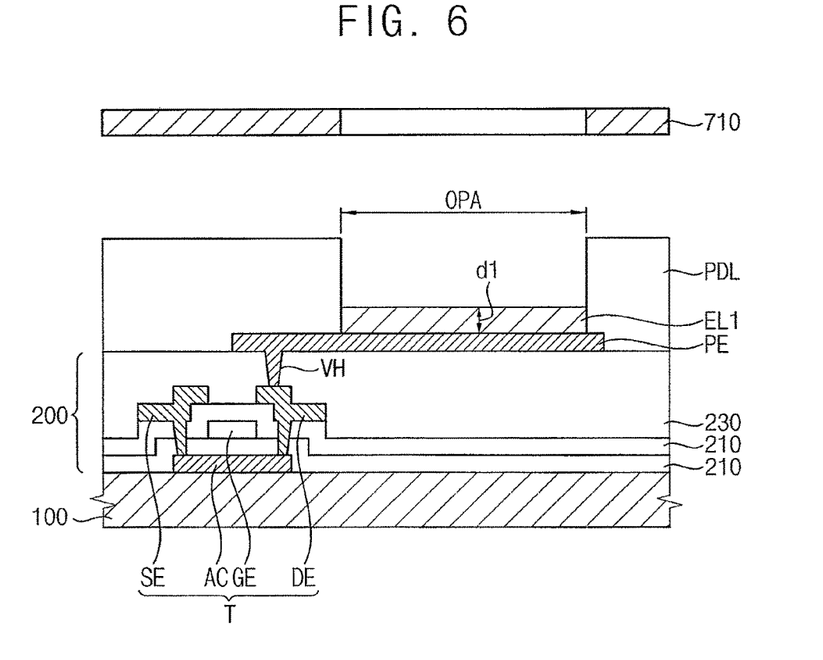
FIGS. 6 to 8 illustrate stages of an embodiment of a method for manufacturing a display apparatus.

FIGS. 6 to 8 are cross-sectional views illustrating stages of an embodiment of a method for manufacturing a display apparatus. Referring to FIGS. 5 and 6, an active pattern AC is formed on the base substrate layer 100. A gate insulating layer 210 is formed on the base substrate layer 100 on which the active pattern AC is formed. A gate electrode GE is formed on the gate insulating layer 210. An intercalation insulating layer 220 is formed on the base substrate layer 100 on which the gate electrode GE is formed.

Additionally, a source electrode SE and a drain electrode DE are formed on the intercalation insulating layer 220. A planarization layer 230 is formed on the base substrate layer 100 on which the source electrode SE and the drain electrode DE are formed. Therefore, a circuit layer 200 may be formed on the base substrate layer 100.

Then, a via-hole VH which exposes the drain electrode DE is formed in the planarization layer 230.

A pixel electrode PE is formed on the planarization layer 230 and the pixel electrode PE is connected to the drain electrode DE through the via-hole VH.

A pixel definition layer PDL is formed on the planarization layer 230 on which the pixel electrode PE is formed.

An opening OP which defines an area of the light-emitting element E is formed in the pixel definition layer PDL.

A first light-emitting layer EL1 is formed in an opening area OPA using a first mask 710. A first step pattern having a first thickness d1 may be formed by the first light-emitting layer EL1.

Figure 7:
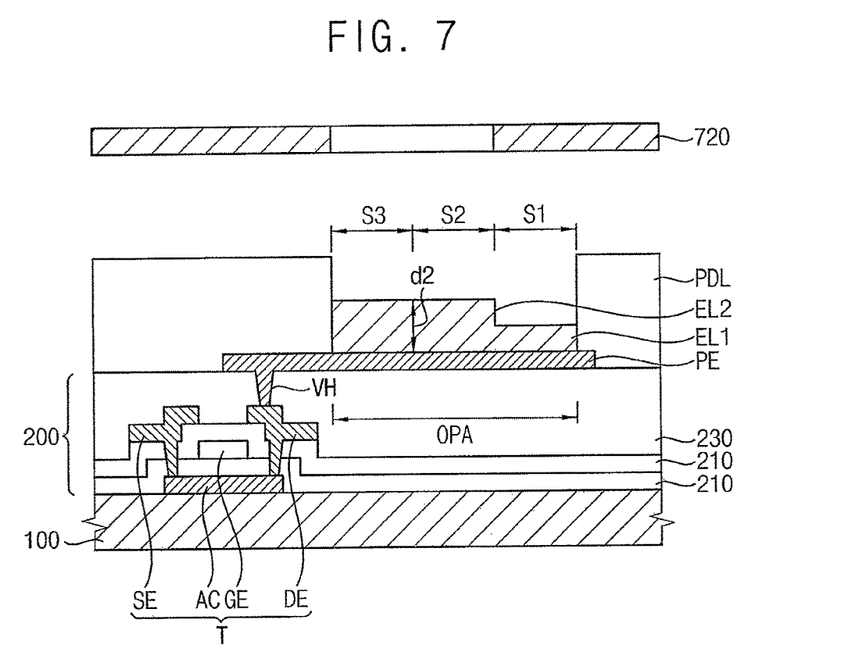

Referring to FIGS. 5 and 7, a second light-emitting layer EL2 is formed in second and third step areas S2 and S3, except for the first step area S1 of the opening area OPA using a second mask 720. A second step pattern having a second thickness d2 may be formed by the second light-emitting layer EL2.

Figure 8:
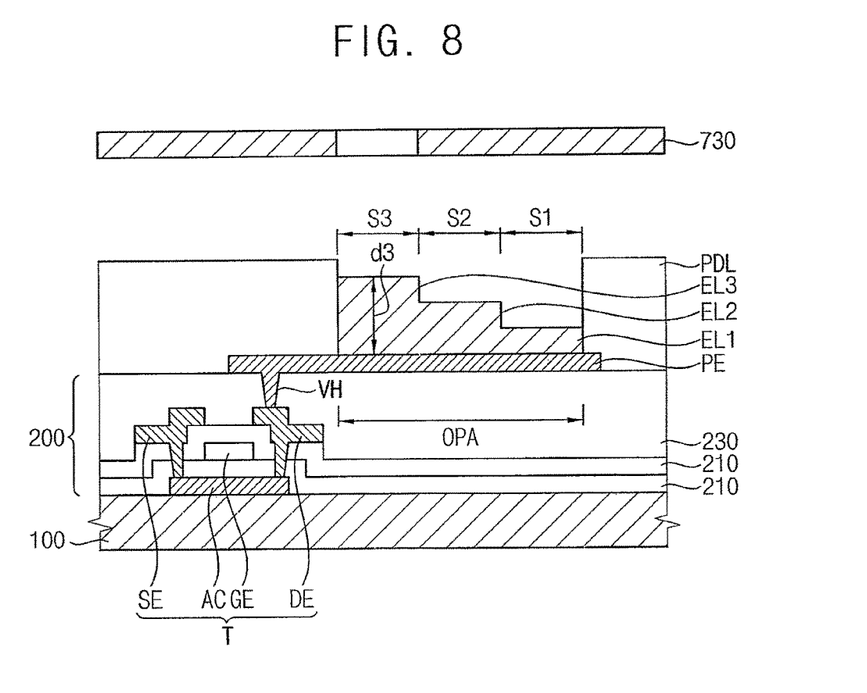

Referring to FIGS. 5 and 8, a third light-emitting layer EL3 is formed in a third step area S3, except for the first and second step areas S1 and S2 of the opening area OPA using a third mask 730. A third step pattern having a third thickness d3 may be formed by the third light-emitting layer EL3.

As described above, the exiting surface of the light-emitting element may be inclined by the light-emitting layer having a step shape. The inclined angle of the exiting surface may be adjusted, for example, through various injection processes.

Figure 9:
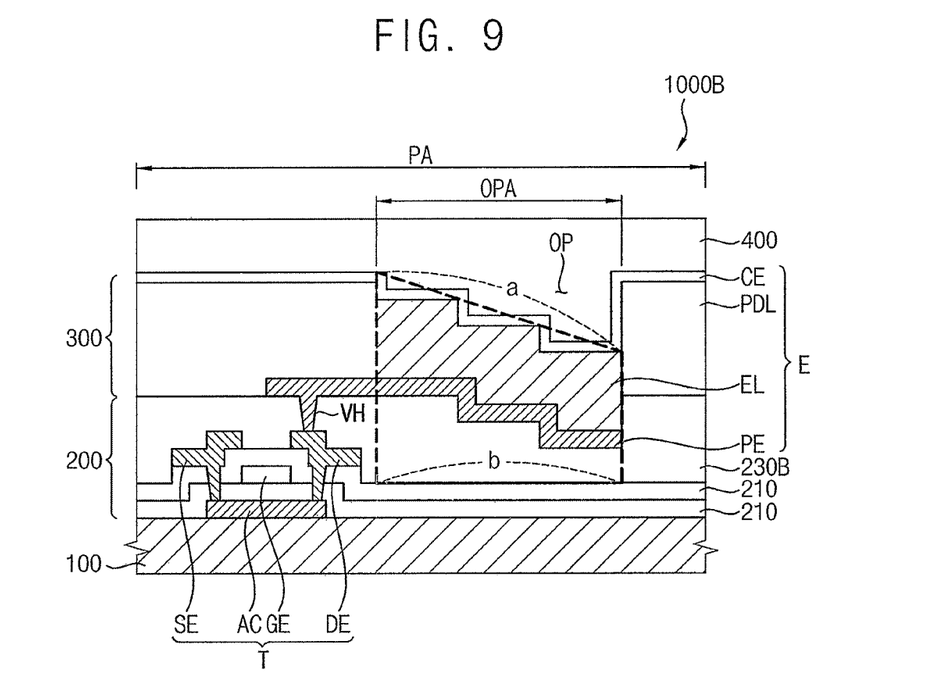
FIG. 9 illustrates another embodiment of a display apparatus.

FIG. 9 illustrates a cross-sectional view of another embodiment of a display apparatus 1000B which may include a base substrate layer 100, a circuit layer 200B, a light-emitting element layer 300B, and an encapsulation layer 400. The base substrate layer 100 may include transparent plastic, for example, polyimide, polyethylenenaphtalate, polyethyleneterephthalate, polyarylate, polycarbonate, polyrtherlmide, or polyethersulfone. The base substrate layer 100 may include a plurality of pixel areas PA respectively corresponding to a plurality of pixels.

The circuit layer 200B may be on the base substrate layer 100 and may include at least one transistor T. The transistor T may include an active pattern AC, a gate electrode GE, a source electrode SE, and a drain electrode DE. A gate insulating layer 210 may be between the active pattern AC and the gate electrode GE. The active pattern AC may be formed, for example, of a semiconductor oxide including a binary compound (ABx), a ternary compound (ABxCy), a quaternary compound (ABxCyDz), or another compound, which includes, for example, indium, zinc, gallium, tin, titanium, aluminum, hafnium (Hf), zirconium (Zr), or magnesium (Mg). These compounds may be used alone or in combination. The gate insulating layer 210 may include, for example, a silicone compound, a metallic oxide, or another material.

An intercalation insulating layer 220 may be between the gate electrode GE and the source electrode SE. The intercalation insulating layer 220 may be between the gate electrode GE and the drain electrode DE. The intercalation insulating layer 220210 may include, for example, silicon nitride, silicon oxide, or silicon oxynitride.

A planarization layer 230B may be on the transistor T to a predetermined thickness to protect the transistor T. According to the exemplary embodiment, planarization layer 230B may include a step pattern in an area corresponding to the opening area OPA in which the light-emitting element E is formed. The light-emitting element E is on the step pattern of the planarization layer 230B. Thus, an exiting surface of light-emitting element E may have a step shape in a cross-sectional view.

The light-emitting element layer 300B may be on the circuit layer 200B and may include a pixel electrode PE, a pixel definition layer PDL, a light-emitting layer EL, and a common electrode CE. The pixel electrode PE may be connected to the transistor T through a via-hole VH in the planarization layer 230B.

The pixel definition layer PDL may be on the planarization layer 230B on which the pixel electrode PE is formed, and may include an opening OP which defines the light-emitting element E. The light-emitting layer EL may be in an opening OP. The common electrode CE may be on the light-emitting layer EL and the pixel definition layer PDL. The light-emitting element E may be defined by the pixel electrode PE, the pixel definition layer PDL, the light-emitting layer EL, and the common electrode CE.

The encapsulation layer 400 may be on the common electrode CE and may include a plurality of inorganic layers or a suitable combination thereof. The encapsulation layer 400 may protect the light-emitting element E.

According to the exemplary embodiment, in a cross-sectional view, the planarization layer may include the step pattern. Thus, the exiting surface of the light-emitting element on the planarization layer may be inclined. The angle of inclination of the exiting surface may be determined according to the curvature of an area of the display area in which the light-emitting element is located. The length of the deposited surface may be determined according to the inclined angle.

Figure 10:
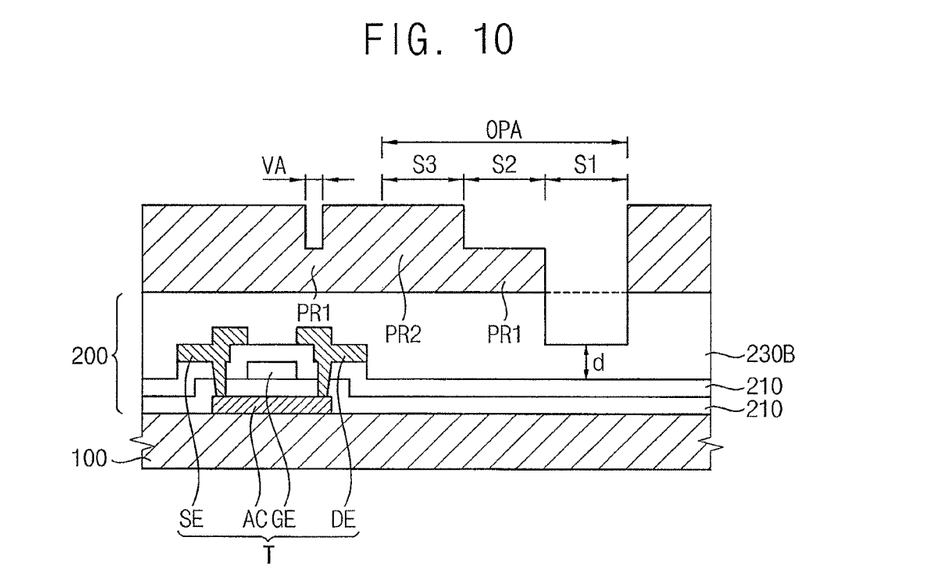
FIGS. 10 and 11 illustrate stages of another embodiment of a method for manufacturing a display apparatus.
Figure 11:
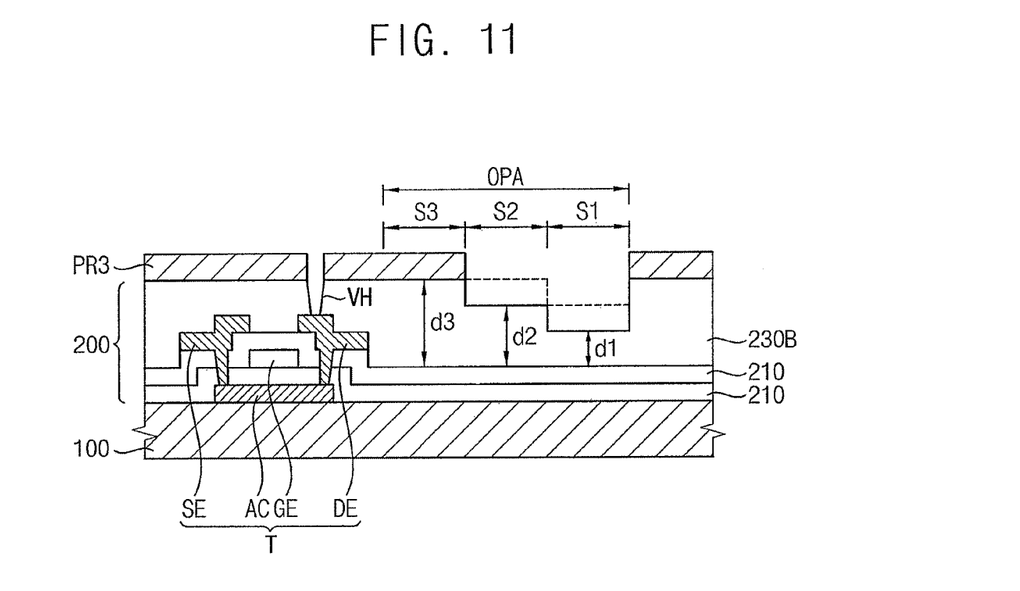

FIGS. 10 and 11 illustrate cross-sectional views of other embodiments of method for manufacturing a display apparatus.

Referring to FIGS. 9 and 10, an active pattern AC is formed on the base substrate layer 100. A gate insulating layer 210 is formed on the base substrate layer 100 on which the active pattern AC is formed. A gate electrode GE is formed on the gate insulating layer 210. An intercalation insulating layer 220 is formed on the base substrate layer 100 on which the gate electrode GE is formed. A source electrode SE and a drain electrode DE are formed on the intercalation insulating layer 220. A planarization layer 230B is formed on the base substrate layer 100 on which the source electrode SE and the drain electrode DE are formed.

A photoresist pattern is formed on the planarization layer 230B and is disposed in an area, except for a first step area S1 of the opening area OPA corresponding to the opening of the pixel definition layer.

The photoresist pattern may include a first photo pattern PR1 and a second photo pattern PR2 which are different from each other. The first photo pattern PR1 is in a second step area S2 of the opening area OPA and a via-area VA corresponding to a via-hole. The second photo pattern PR2 is thicker than the first photo pattern PR1 and is in remaining area, except for the area in which the first photo pattern PR1 is formed. For example, the second photo pattern PR2 may be in an area, except for the first step area S1, the second step area S2, and the via-area VA.

The planarization layer 230B is patterned using the photoresist pattern PR1 and PR2. Thus, a first step pattern having a first thickness d1 is in the first step area S1.

Referring to FIGS. 9 and 11, the first and second photo patterns PR1 and PR2 may be removed by a predetermined thickness, for example, through an ashing process using oxygen plasma. Thus, a third photo pattern PR3 is formed in areas corresponding to the second photo pattern PR2, and the planarization layer 230B is exposed in areas corresponding to the first photo pattern PR1. Thus, the photo patterns of the via-area VA and the first and second step areas S1 and S2 are removed and the planarization layer 230B is exposed.

The planarization layer 230B is patterned using the third photo pattern PR3. Therefore, the first step pattern having a first thickness d1 is formed in the first step area S1. A second step pattern having a second thickness d2 thicker than the first thickness d1 is formed in the second step area S2. A third step pattern having a third thickness d3 thicker than the second thickness d2 is formed in the third step area S3. A via-hole VH exposing the drain electrode DE of the transistor T is formed in the via-area VA. Then, a light-emitting element layer 300B is formed on the planarization layer 230B.

Referring to FIG. 9, a pixel electrode PE is connected to the transistor T through the via-hole VH. A pixel definition layer PDL is formed on the planarization layer 230B on which the pixel electrode PE is formed. An opening OP which defines an area of the light-emitting element E is formed in the pixel definition layer PDL and overlaps the pixel electrode PE. A light-emitting layer EL is formed in the opening OP using a single mask. The light-emitting layer EL may have a step shape in a cross-sectional view. A common electrode CE is formed on the light-emitting layer EL. Then, an encapsulation layer 400 is formed on the light-emitting element layer 300B.

As described above, the planarization layer may include the step pattern formed in the opening area in which the light-emitting element is formed. Thus, the exiting surface of the light-emitting element may be inclined. The angle of inclination of the exiting surface may be adjusted through various injection processes.

Figure 12:
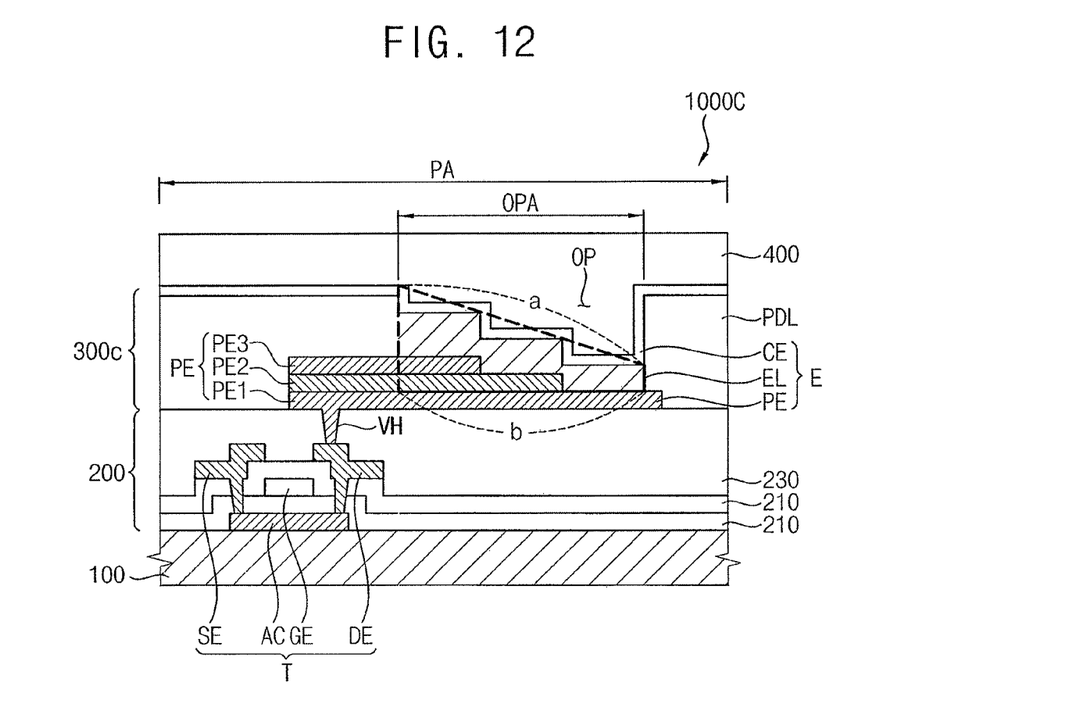
FIG. 12 illustrates another embodiment of a display apparatus.

FIG. 12 illustrates a cross-sectional view of another embodiment of a display apparatus 1000C which may include a base substrate layer 100, a circuit layer 200, a light-emitting element layer 300C, and an encapsulation layer 400. The base substrate layer 100 may include, for example, transparent plastic, for example, polyimide, polyethylenenaphtalate, polyethyleneterephtalate, polyarylate, polycarbonate, polyrtherlmide, or polyethersulfone. The base substrate layer 100 may include a plurality of pixel areas PA respectively corresponding to a plurality of pixels.

The circuit layer 200 may be on the base substrate layer 100 and may include at least one transistor T. The transistor T may include an active pattern AC, a gate electrode GE, a source electrode SE, and a drain electrode DE. A gate insulating layer 210 may be between the active pattern AC and the gate electrode GE. The active pattern ACT may be forming, for example, of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), or magnesium (Mg). These compounds may be used alone or in combination thereof. The gate insulating layer 210 may include, for example, silicone compound, metallic oxide, or another material.

An intercalation insulating layer 220 may be between the gate electrode GE and the source electrode SE. The intercalation insulating layer 220 may be between the gate electrode GE and the drain electrode DE. The intercalation insulating layer 220 may include, for example, silicon nitride, silicon oxide, or silicon oxynitride. A planarization layer 230 may be disposed to a predetermined thickness on the transistor T to protect the transistor T and may serve to level a surface of the display apparatus.

The light-emitting element layer 300C may be on the circuit layer 200 and may include a pixel electrode PE, a pixel definition layer PDL, a light-emitting layer EL, and a common electrode CE.

According to the exemplary embodiment, the pixel electrode PE may include electrode patterns of a step shape. For example, the pixel electrode PE may include a first electrode pattern PE1, a second electrode pattern PE2, and a third electrode pattern PE3 which have different lengths.

In a cross-sectional view, the pixel electrode PE including the first, second, and third electrode patterns PE1, PE2 and PE3 may have a step shape in the opening area OPA in which the light-emitting element E is formed. An exiting surface of the light-emitting element E may have the step shape according to the pixel electrode PE, which has a step shape in a cross-sectional view.

The pixel definition layer PDL may be on the planarization layer 230 on which the pixel electrode PE is Ruined, and may include an opening OP which defines the light-emitting element E. For example, the opening OP may expose the pixel electrode PE, and a deposited surface b of the light-emitting element E may be defined by the exposed pixel electrode PE.

The light-emitting layer EL may be in an opening OP and may have the step shape by the pixel electrode PE having the step shape in a cross-sectional view.

The common electrode CE may be on the light-emitting layer EL and the pixel definition layer PDL. The light-emitting element E may be defined by the pixel electrode PE, the pixel definition layer PDL, the light-emitting layer EL, and the common electrode CE.

The encapsulation layer 400 may be on the common electrode CE and may include a plurality of inorganic layers or a suitable combination thereof. The encapsulation layer 400 may protect the light-emitting element E.

According to the exemplary embodiment, in a cross-sectional view, the exit surface of the light-emitting element may be inclined by the pixel electrode PE having a step shape. The angle of inclination of the exit surface may be determined according to the curvature of an area of the display area in which the light-emitting element is located. The length of the deposited surface may be determined according to the inclined angle.

Figure 13:
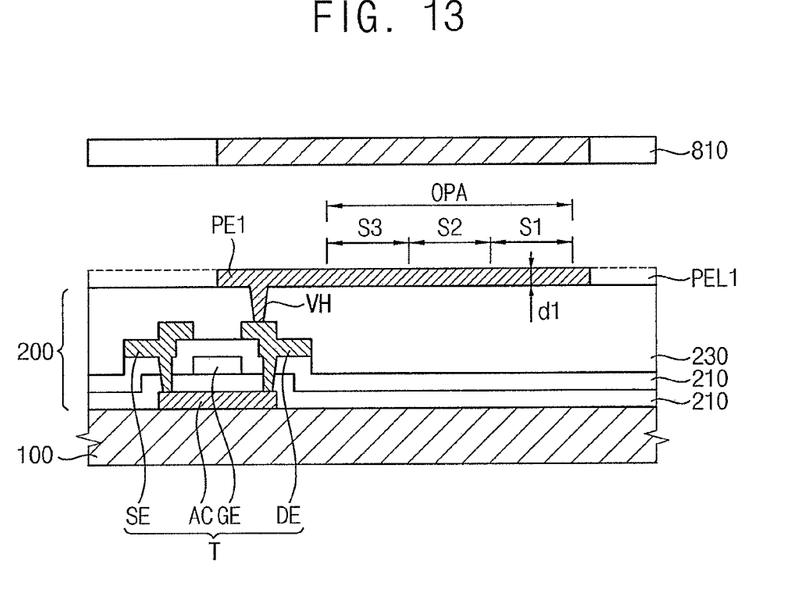
FIGS. 13 to 15 illustrate stages of another embodiment of a method for manufacturing a display apparatus.

FIGS. 13 to 15 illustrate cross-sectional views of another embodiment of a method for manufacturing a display apparatus. Referring to FIGS. 12 and 13, an active pattern AC is formed on the base substrate layer 100. A gate insulating layer 210 is formed on the base substrate layer 100 on which the active pattern AC is formed. A gate electrode GE is formed on the gate insulating layer 210. An intercalation insulating layer 220 is formed on the base substrate layer 100 on which the gate electrode GE is formed. A source electrode SE and a drain electrode DE are formed on the intercalation insulating layer 220. A planarization layer 230 is formed on the base substrate layer 100 on which the source electrode SE and the drain electrode DE are formed. Therefore, a circuit layer 200 may be formed on the base substrate layer 100.

Then, a via-hole VH which exposes the drain electrode DE is formed in the planarization layer 230. A first pixel electrode layer PELT is formed on the planarization layer 230 including the via-hole VH and has a first thickness d1. The pixel electrode layer PEL1 may be formed, for example, of metal, alloy, metal nitride, conductive metal oxide, transparent conductive material, or another material.

The first pixel electrode layer PEL1 is patterned to form a first electrode pattern PE1, which is connected to the drain electrode DE through the via-hole VH using a first mask 810. The first electrode pattern PE1 may be formed in the opening area OPA. The first electrode pattern PE1 may form a first step in a first step area S1 of the opening area OPA.

Figure 14:
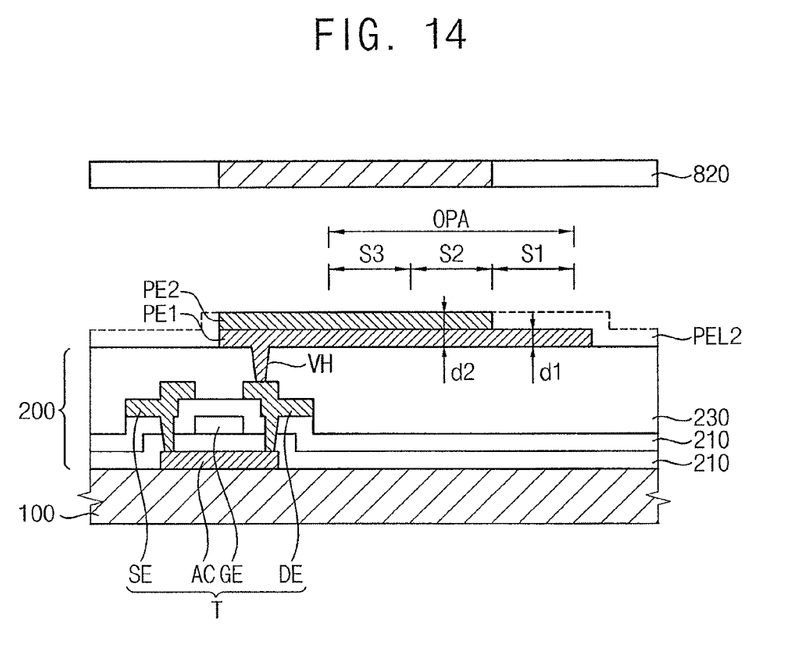

Referring to FIGS. 12 and 14, a second pixel electrode layer PEL2 is formed on the planarization layer 230 on which the first electrode pattern PE1 is formed. The second pixel electrode layer PEL2 may be formed, for example, of metal, alloy, metal nitride, conductive metal oxide, transparent conductive material, or another material. The second pixel electrode layer PEL2 may have an etch selectivity different from that of the first pixel electrode layer PEL1.

The second pixel electrode layer PEL2 is patterned to from a second electrode pattern PE2 using a second mask 820. The second electrode pattern PE2 may be formed in second and third step areas S2 and S3, except for the first step area S1 of the opening area OPA. Therefore, the first and second electrode patterns PE1 and PE2 may be stacked and have a second thickness d2 in the second and third step areas S2 and S3. The second electrode pattern PE2 may form a second step formed in the second step area S2 of the opening area OPA.

Figure 15:
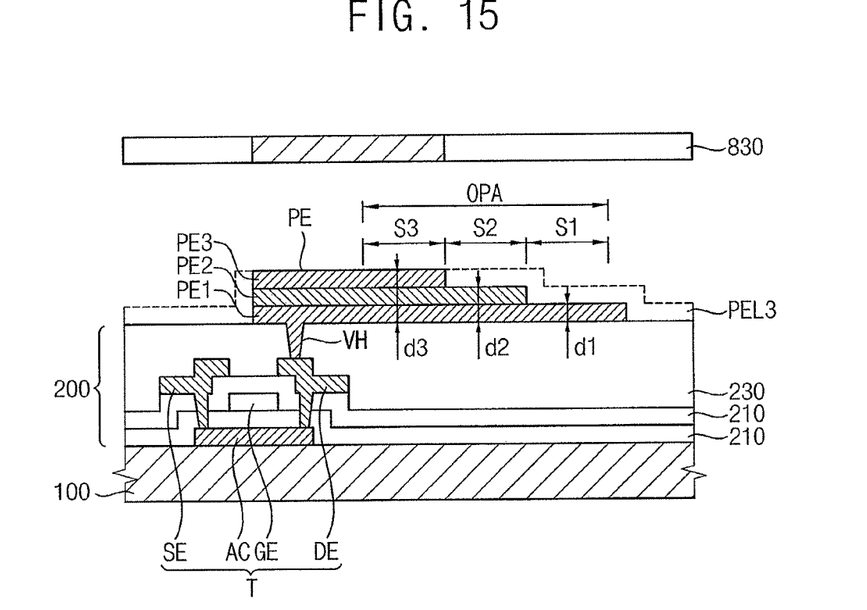

Referring to FIGS. 12 and 15, a third pixel electrode layer PEL3 is formed on the planarization layer 230 on which the first and second electrode patterns PE1 and PE2 are stacked. The third pixel electrode layer PEL3 may be formed, for example, of metal, alloy, metal nitride, conductive metal oxide, transparent conductive material, or another material. The third pixel electrode layer PEL3 may have an etch selectivity different from those of the first and second pixel electrode layers PEL1 and PEL2.

The third pixel electrode layer PEL3 is patterned to form a third electrode pattern PE3 using a third mask 830. The third electrode pattern PE3 is formed in a third step area S3, except for first and second step areas S1 and S2 of the opening area OPA. Therefore, the first, second and third electrode patterns PE1, PE2 and PE3 may be stacked and have a third thickness d3 in the third step area S3. The third electrode pattern PE3 may form a third step formed in the third step area S3 of the opening area OPA. As described above, the pixel electrode PE having the step shape is formed in the opening area OPA.

A pixel definition layer PDL is formed on the planarization layer 230 on which the pixel electrode PE having the step shape is formed, and may include an opening OP which defines the light-emitting element E.

A light-emitting layer EL is formed in the opening OP using a single mask. Referring to FIG. 12, the light-emitting layer EL may have a step shape in a cross-sectional view by the pixel electrode PE having a step shape. A common electrode CE is formed on the light-emitting layer EL. Then, an encapsulation layer 400 is formed on the light-emitting element layer 300C.

As described above, the light-emitting element may include the pixel electrode having the step shape. Thus, the exiting surface of the light-emitting element may be inclined. The angle of inclination of the exiting surface may be adjusted through various deposition processes.

In accordance with one or more of the aforementioned embodiments, a display apparatus includes a display area with a convex surface. A light-emitting element may include an exiting surface that is inclined according to the curvature of the display area in which the light-emitting element is located. Thus, the visibility of an image displayed on the display area may be improved.

The present embodiments may be applied to a display device and an electronic device having a display device. For example, the present embodiments may be applied, for example, to a computer monitor, a laptop, a digital camera, a cellular phone, a smart phone, a smart pad, a television, a personal digital assistant (PDA), a portable multimedia player (PMP), a MP3 player, a navigation system, a game console, a video phone, or another electronic device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
   a display substrate including a display area of a convex surface having a curvature;
   a first light-emitting element in a first area corresponding to a central area of the display area and including a first exiting surface;
   a second light-emitting element in a second area adjacent to a first side portion of the first area and including a second exiting surface having a first angle of inclination corresponding to a curvature of the second area; and
   a third light-emitting element in a third area adjacent to a first side portion of the second area and including a third exiting surface having a second angle of inclination corresponding to a curvature of the third area, wherein
   the second and third exiting surfaces are parallel to the first exiting surface.

2. The display apparatus as claimed in claim 1, wherein the first, second, and third exiting surfaces have equal lengths.

3. The display apparatus as claimed in claim 1, wherein the second angle of inclination is greater than the first angle of inclination.

4. The display apparatus as claimed in claim 1, wherein:
   the first light-emitting element includes a first deposited surface on which the first light-emitting element is formed and is opposite to the first exiting surface,
   the second light-emitting element includes a second deposited surface on which the second light-emitting element is formed and is opposite to the second exiting surface, and
   the third light-emitting element includes a third deposited surface on which the third light-emitting element is formed and is opposite to the third exiting surface.

5. The display apparatus as claimed in claim 4, wherein a length of the second deposited surface is based on the first angle of inclination.

6. The display apparatus as claimed in claim 4, wherein a length of the third deposited surface is based on the second angle of inclination.

7. The display apparatus as claimed in claim 4, further comprising:
   a fourth light-emitting element in a fourth area adjacent to a second side portion of the first area and including a fourth exiting surface having a third angle of inclination opposite to the first angle of inclination; and
   a fifth light-emitting element in a fifth area adjacent to a second side portion of the fourth area and including a fifth exiting surface having a fourth angle of inclination opposite to the second angle of inclination.

8. The display apparatus as claimed in claim 7, wherein the fourth and fifth exiting surfaces are parallel to the first exiting surface.

9. The display apparatus as claimed in claim 7, wherein the first, fourth, and fifth exiting surfaces have equal lengths.

* * * * *